United States Patent
Garbelli et al.

[11] Patent Number: 5,825,628
[45] Date of Patent: Oct. 20, 1998

[54] ELECTRONIC PACKAGE WITH ENHANCED PAD DESIGN

[75] Inventors: Francesco Garbelli, Arcore; Stefano Oggioni, Vimercate, both of Italy

[73] Assignee: International Business Machines Corporation, Armonk, N.Y.

[21] Appl. No.: 849,578

[22] PCT Filed: Oct. 3, 1996

[86] PCT No.: PCT/GB96/02420

§ 371 Date: Jun. 3, 1997

§ 102(e) Date: Jun. 3, 1997

[87] PCT Pub. No.: WO97/13275

PCT Pub. Date: Apr. 10, 1997

[51] Int. Cl.[6] .............................. H01L 25/00; H05K 1/18
[52] U.S. Cl. .................... 361/763; 361/764; 361/767; 361/772; 361/773; 361/774; 361/777; 361/783; 361/784; 257/684; 257/690; 257/692; 257/735; 257/738; 257/774; 257/778; 257/780; 257/782; 257/784
[58] Field of Search ........................ 361/763, 764, 361/767, 772, 773, 774, 777, 778, 783, 784, 791, 751; 257/684, 686, 690, 692, 694, 735, 738, 774, 778, 780, 782, 784

[56] References Cited

U.S. PATENT DOCUMENTS

| | | | |
|---|---|---|---|
| 4,578,573 | 3/1986 | Flies et al. | 235/492 |
| 4,595,945 | 6/1986 | Graver | 357/70 |
| 4,714,952 | 12/1987 | Takekawa et al. | 257/665 |
| 5,229,846 | 7/1993 | Kozuka | 257/678 |
| 5,258,648 | 11/1993 | Lin | 257/778 |
| 5,285,352 | 2/1994 | Pastore et al. | 361/707 |
| 5,355,283 | 10/1994 | Marrs et al. | 361/760 |
| 5,389,817 | 2/1995 | Imamura et al. | 257/666 |
| 5,468,999 | 11/1995 | Lin et al. | 257/784 |
| 5,474,958 | 12/1995 | Djennas et al. | 437/211 |

FOREIGN PATENT DOCUMENTS

| | | | |
|---|---|---|---|
| 0 285 064 A2 | 3/1988 | European Pat. Off. | H01L 23/52 |
| 0 382 203 A2 | 2/1990 | European Pat. Off. | H01L 23/057 |
| 4022162 | 1/1992 | Japan . | |
| 4139864 | 5/1992 | Japan . | |

OTHER PUBLICATIONS

W.E. Bernier, B.T. Ma, P.A. Mescher, A.K. Trivedi and E.J. Vytlacil, "BGA vs. QFP", Circuits Assembly (USA) vol. 6, No. 3, Mar. 1995, pp. 38–40.

Primary Examiner—Leo P. Picard
Assistant Examiner—David Foster
Attorney, Agent, or Firm—Ira D. Blecker

[57] ABSTRACT

An electronic package (400), particularly a BGA, including a circuitized substrate (120) and one or more active devices (110) attached thereon by means of corresponding conductive pads provided on a surface of the substrate (120); each conductive pad is splitted in a plurality of parts (212–218) not in contact. Such parts (212–218) may be separated by a wireable area of the substrate (120), thereby providing one or more wiring channels. In addition, the same parts (212–218) may be connected in interfacing couples at different electrical potentials (ground and power) and decoupled to each other by means of capacitors (410); the connections to the ground and power are achieved by metallized holes provided through the substrate (120).

10 Claims, 3 Drawing Sheets

ELECTRONIC PACKAGE WITH ENHANCED PAD DESIGN

BACKGROUND OF THE INVENTION

The present invention relates to an electronic package and particularly, but not exclusively, to an electronic package including a substrate and at least one device, each of said at least one device being attached to said substrate by means of a conductive pad provided on a surface of said substrate.

An electronic package typically includes a circuitized substrate with one or more active devices attached thereon; packages including only one device are known as Single Chip Modules (SCM), while packages including a plurality of devices are called Multi Chip Modules (MCM). The use of attach materials, such as a glue, is common in electronic packaging applications for attaching the devices to the substrate, particularly in Ball Grid Array (BGA) packages.

BGA packages are a quite recent development in the electronic packaging industry replacing the current products as the Quad Flat Packs (QFP). The main difference is the connection system to the printed circuit board (PCB), also called second level attachment, that is made through eutectic Tin Lead alloy balls arranged in a matrix layout on the bottom side of a substrate, instead of metal leads placed along the peripheral corner of the plastic component body. BCA and QFP packages are described in "Circuits Assembly (U.S.A.)—Vol.6, No.3 March 1995 Pag.38–40".

Each device is commonly attached to the substrate by means of a conductive pad, typically a little bigger that the corresponding attached device, provided on the top surface of the substrate. These pads provide a better compatibility with the glue material; in addition, they facilitate for some extent the heat transfer from the back of the device into the substrate by conduction.

A drawback of the prior art is that each pad causes a waste of a big area on the top surface of the substrate that cannot be wired and then it is not at all available for the routing of connecting lines. This problem is particularly serious in a Multi Chip Module, wherein the wasted area not available for wiring has to be multiplied by the number of devices. This problem involves increasing the electronic package dimensions or reducing the number of devices installed on the same substrate, increasing the number of modules required for the same application.

In order to increase the wireability of the electronic package, a current methodology it that of sacrifying the pad and using the freed area of the substrate for wiring; however, this solution causes a degradation of the thermal performances of the package, particularly in organic substrates, with a value of thermal dissipation typically not greater than 0.5 W. A different approach is to modify the substrate, either changing the raw-materials and technologies toward more conductive ones, like ceramic carriers, or increasing the number of layers thereof; both solutions however are more expensive and increases the cost of the whole package.

A further problem is that these modules, as any other electronic components, need to be decoupled with capacitors to reduce signal noise either at the application board level or at module substrate.

The signal noise optimisation is usually addressed bridging with capacitors power and ground as close as possible to the active device. When these capacitors are on board at the package level, they require a specific wiring pattern and than impact the already small real estate available for the circuitry, enlarging consequently the total module dimensions. On the contrary, when the capacitors are assembled on the mother board where the modules are, they provide very often a barely acceptable level of noise reduction.

BRIEF SUMMARY OF THE INVENTION

The above drawbacks of the prior art are overcome by the invention as claimed. Accordingly, the present invention provides an electronic package as set out above which is characterised in that said pad is composed by a plurality of parts not in contact.

This solution allows solving both the above mentioned problems. Particularly, it allows increasing the electrical wireability of the substrate top layer and enhancing the electrical signal noise level abatement of the electronic package.

The proposed solution is fully compatible with the existing materials and does not affect their properties; it is cheap and of extremely easy implementation. In addition, the packaging method involved by the present invention is fully compatible with the current processes and related equipment used in the industry.

These advantages are obtained by the present invention without degrading the thermal dissipation of the whole package; the delta heat dissipation capability driven by the differences between a full pad metal surface and the proposed design is negligible.

In a particular embodiment of the present invention, said plurality of parts are separated by a wireable area of said substrate.

This free area between each couple of adjacent parts provides one or more wiring channels for the routing of connecting lines, thereby increasing the substrate wireability with regard to the available real estate or overall dimension of the package. This embodiment of the present invention then involves decreasing the electronic package dimensions required for a particular application; on the contrary, it allows a greater number of devices to be installed on the same substrate, decreasing the number of modules required for the same application.

Preferably, said device includes four corners, said pad being composed by four parts and said wireable area having the form of a cross extending from said corners.

This shape is particularly advantageous because the density of signals increases greatly at corners; therefore, the wiring channels starting from the corners of the device make easier the wiring fan out.

In an advantageous embodiment, said electronic package is a multi chip module. In a package including a plurality of devices, the proposed pad design gets the maximum effect on the overall package costs and performances.

In a further particular embodiment of the present invention, at least a first of said parts is connected to a ground potential and at least a second of said parts is connected to a power potential, said first and said second parts being connected to each other by means of a decoupling capacitor.

This solution provides a better device decoupling action. It allows a signal noise abatement for electrical performances bridging with capacitors power and ground very close to the active device. In addition, this solution does not impact the real estate available on the substrate with a dedicated circuitry.

Preferably, said substrate includes at least one conductive hole connected to at least one of said parts.

This embodiment of the present invention increases the package thermal dissipation, extending the applicability of this electronic packaging technology to a wider range of applications.

Advantageously, the electronic package comprises a further pad provided on a further surface of said substrate, said further pad being composed by a plurality of further parts not in contact, at least one of said further parts being connected to a corresponding one of said parts by means of at least one of said holes.

The resulting path is a heat dissipation solution that increases the overall packaging thermal performances and helps in managing very effectively the thermal dissipation factor for the device. The result is a generalised spread of the heat that may be easily dissipated into the mother board.

In a particularly advantageous embodiment of the present invention, said substrate includes a ground layer and a power layer, said first part being connected to said ground layer by means of a first of said holes and said second part being connected to said power layer by means of a second of said holes.

In this embodiment, the connections to the decoupling capacitor may be achieved through via on pads design with no extra wiring required beyond the drilled holes to drive the connections from the inner layers (power or ground) to the top surface of the laminate; the capacitors may then be assembled close to the device, enhancing the device electrical performances and allowing an ideal device decoupling.

In addition, this connection further enhances the heat dissipation factor of the package through the metallic ground and power planes and extends the thermal dissipation factor to all the ground module connections toward the mother board interface.

In a further advantageous embodiment of the present invention, said first part is connected to said ground potential by means of a corresponding first of said further parts and said second part is connected to said power potential by means of a corresponding second of said further parts.

These further parts provided on the bottom surface of the substrate offers very short connections to the bonding pads presents on the same side not requiring drilled holes for those connections. These bonding pads provide multi access points with resulting very low resistance values.

Different types of electronic packages may be used to implement the present invention, such as QFP, BGA, either SCM or MCM; typically, said electronic package is a BGA.

BRIEF DESCRIPTION OF THE DRAWINGS

Various embodiments of the invention will now be described in detail by way of examples, with reference to accompanying figures, where.

DETAILED DESCRIPTION OF THE INVENTION

Figure 1:
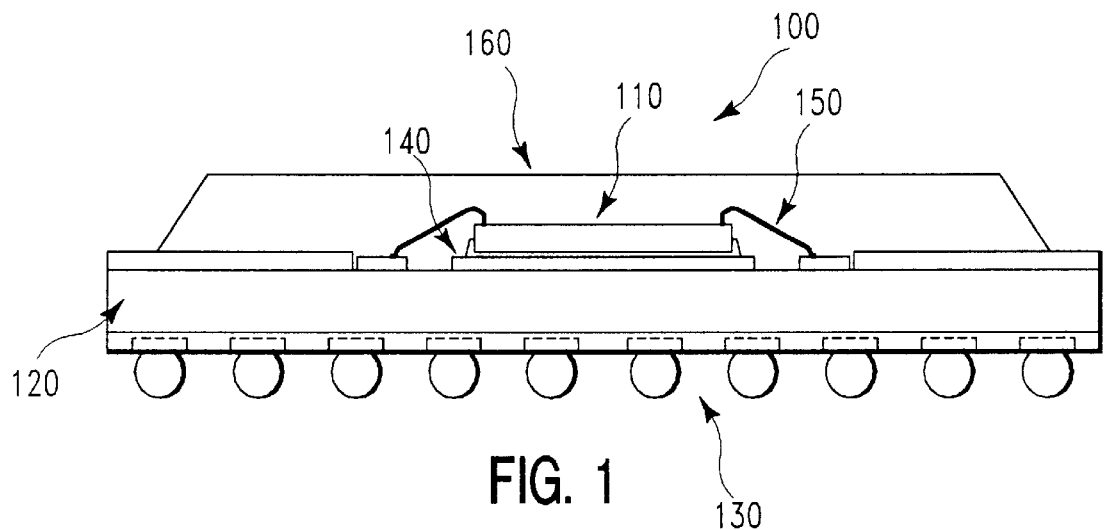
FIG. 1 is an electronic package according to the prior art.

With reference now to the figures and in particular with reference to FIG. 1, a cross-sectional view of an electronic package according to the prior art is shown. The figure depicts particularly a BGA 100 including a device 110 attached to a circuitized substrate 120 by means of a glue layer. The substrate 120 is provided on its bottom side with a plurality of connecting balls or bumps 130 arranged in a matrix layout; the connecting balls 130 are typically eutectic solder, such as Tin Lead alloy. These balls 130 are used to connect the BGA package to a Printed Circuit Board (not shown). Different types of BGA are available, such as Plastic Ball Grid Array (PBGA), Ceramic Ball Grid Array (CBGA) and Tape Ball Grid Array (TBGA), the primary difference being the type of substrate material.

The device 110 is attached to the substrate 120 by means of a conductive pad 140 provided on the top surface of the substrate 120. This area, usually a little bigger than the device 110, allows a better compatibility with the glue material and facilitates the heat transfer from the back of the device 110 into the substrate 120 by conduction.

The device 110 is wired to the electrical circuit on the substrate 120 by means of wires 150, through a thermo-sonic wire bonding operation and the assembly is then covered with a plastic resin 160.

Figure 2:
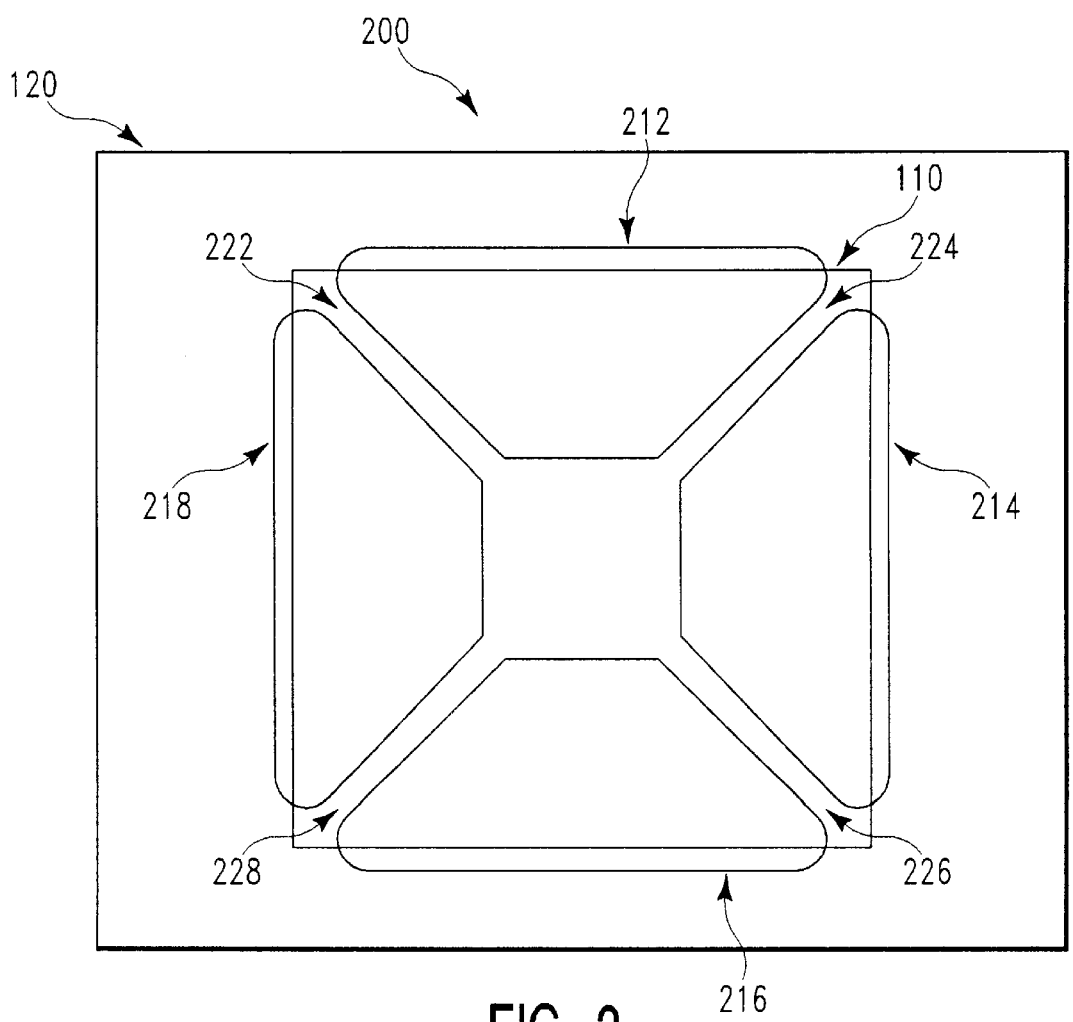
FIG. 2 depicts an electronic package according to an embodiment of the present invention.

With reference now to FIG. 2, a top view of an electronic package according to an embodiment of the present invention is shown. The figure depicts a BGA 200 with the device 110 attached to the substrate 120.

The substrate 120 may be realized with different materials, such as plastic materials, fiberglass laminates, ceramic, polymide, Alumina. Particularly, a quite recently developed electronic packaging technology consists of using an organic substrate, consisting of a composite structure of laminated epoxy woven fibers glass sheets; the organic definition derives from the Epoxies resin compounds (organic chemistry) that are used to build these laminates.

The device 110 is typically a chip or active device, commonly made of Silicon, Germanium or Gallium Arsenide; this device is typically shaped substantially as a rectangular, particularly a square. The device 110 is attached to the substrate 120 usually by means of a glue layer. The glue may be a thermoplastic or thermoset one; typically, it is an epoxy glue, generally loaded with Silver particles for better heat dissipation.

The device 110 is attached to the substrate 120 by means of a conductive pad provided on the top surface of the substrate 120. This pad, allowing a better compatibility with the glue material and facilitating the heat transfer from the back of the device 110 into the substrate 120 by conduction, is usually made of a metallic material, typically copper or nickel and gold plated copper.

In the depicted embodiment of the present invention, the pad is composed by a plurality of parts 212–218 not in contact, so that each couple of adjacent parts of the pad is separated by a free area of the substrate 120. One or more insulating channels 222–228 are then provided in the pad, particularly beyond the device 110. The channels 222–228 shown in the figure are wide enough so that they may be used as wiring channels for the routing of connecting lines, thereby increasing the substrate wireability with regard to the available real estate or overall dimension of the package. Typically, the wiring channels 222–228 allow to draw 4 lines 100 $\mu$m wide (100 $\mu$m space) or 6 lines 75 $\mu$m wide (75 $\mu$m space) for each channel. Those skilled in the art will appreciate that this pad design involves decreasing the electronic package dimensions required for a particular application; on the contrary, it allows a greater number of devices to be installed on the same substrate, decreasing the number of modules required for the same application. The proposed solution is fully compatible with the existing materials and does not affect their properties; it is cheap and of extremely easy implementation. In addition, the packaging method involved by the present invention is fully compatible with the current processes and related equipment used in the industry. It should be noted that the delta heat dissipation capability driven by the differences between a full pad metal surface and the proposed design is negligible.

In a preferred embodiment of the present invention, the pad is split in four separated parts. In the embodiment depicted in FIG. 2, the pad has been split in four different regions or islands 212–218, for their shape recalling the Maltese Cross. Each of the four wiring channels 222–228 extends from a corresponding corner of the device 110 to a central region thereof. The central area may be used to route the wires from one channel to the other or, in the case of a multilayer substrate, to inner layers through vias (blind or through). This shape is particularly advantageous because the density of the signals to be carried to the device 110 increases at the corners; therefore, the wiring channels starting from the corners of the device 110 make easier the fan out from the device 110.

Those skilled in the art will appreciate that the same pad design is applicable to an electronic package including a plurality of devices, such as a multi chip module. Each device is attached to the substrate by means of a corresponding pad. Each pad is split in a plurality of parts not in contact, separated by a free area of the substrate, thereby providing one or more insulating channels available for wiring. It should be noted that the solution according to the present invention is particularly advantageous in a multi chip module, wherein the proposed pad design gets the maximum effect on the overall package costs and performances.

Figure 3:
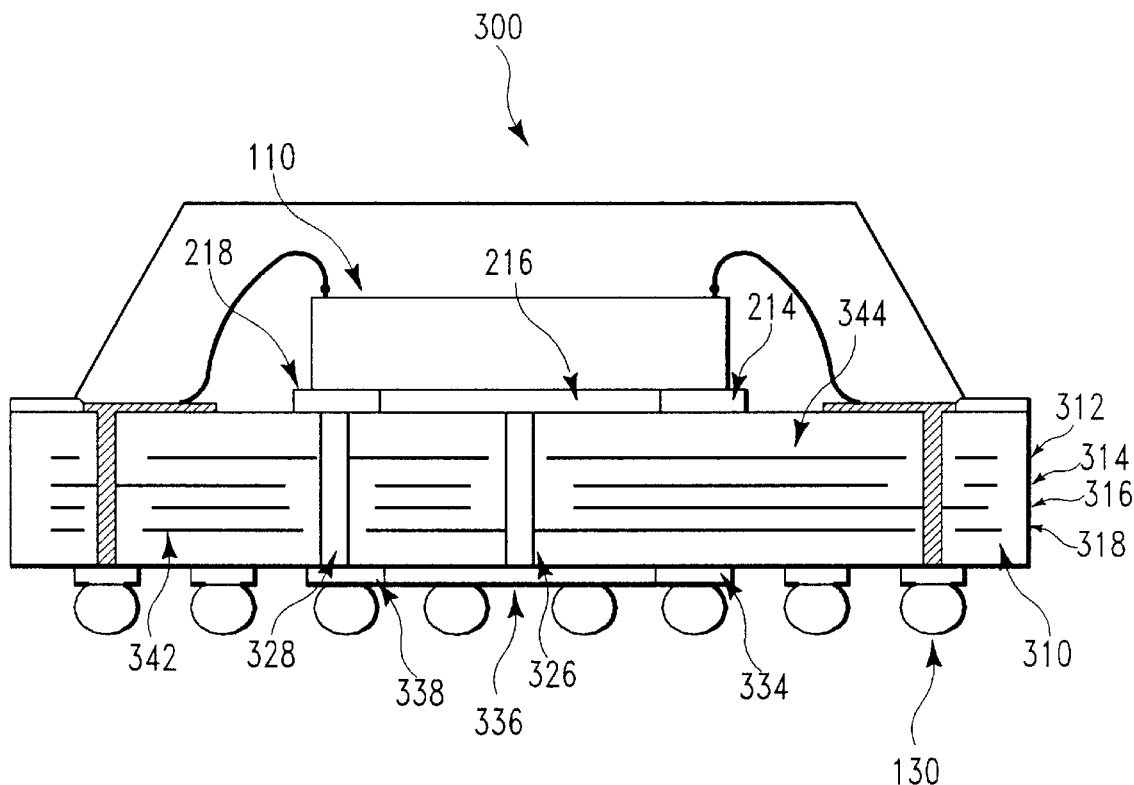
FIG. 3 is an electronic package with increased thermal dissipation.

With reference now to FIG. 3, a cross-sectional view of an electronic package with increased thermal dissipation is shown.

The BGA 300 includes the device 110 attached to a substrate 310. In the depicted embodiment of the present invention, the substrate 310 is a multilayer structure including a plurality of layers 312–318, typically used in Multi Chip Modules.

The device 110 is attached to the substrate 310 by means of the conductive pad described above; particularly, the separate parts 218, 216 and 214 are visible in the figure. As stated in the foregoing, the delta heat dissipation capability driven by the differences between a full pad metal surface and the proposed design is negligible.

However, even when a conductive pad is used, the thermal dissipation of these electronic packages is limited by the bad heat conduction properties of the substrate; this problem sets precise limits, commonly about 1.3 W, to the extendibility of this electronic packaging technology to a wider range of applications.

In order to increase the package thermal management, in the depicted embodiment of the present invention the substrate 310 includes at least one conductive hole, typically a drilled and metallized hole, connected to the pad provided on the top surface of the substrate 310; in this embodiment, the thermal via 326 is connected to the part 216, while the thermal via 328 is connected to the part 218. These thermal vias may in addition be connected to a further pad provided on the bottom surface of the same substrate 310. In a preferred embodiment, this further pad has the same shape of the pad provided on the top surface of the substrate 310. Particularly, it includes a plurality of separate parts 334–338; in the depicted package 300, the thermal via 326 for example connects the part 216 on the top surface of the substrate 310 to a corresponding part 336 on the bottom surface, and hole 328 connects the part 218 to a corresponding part 338.

The further pad on the bottom side of the substrate 310 is connected to the eutectic balls 130 used to connect the BGA package to a Printed Circuit Board (not shown). The result is a generalised spread of the heat that goes dissipated by the full array of balls 130 into the mother board. This heat dissipation path then increases the overall packaging thermal performances, with a thermal dissipation value typically about 2 W.

In the embodiment shown in the figure, the multilayer substrate 310 includes a ground (GND) layer 342 and a power (VCC) layer 344. The thermal vias 326 and 328 are connected to the GND layer 342 and to the VCC layer 344. It should be noted that, being both the GND layer 342 and the VCC layer 344 generally full metallic planes, they are once more enhancing the heat dissipation factor of the package 300. In addition, the connection to the GND layer 342 extends the thermal dissipation factor to all the GND module connections toward the mother board interface.

Figure 4A:
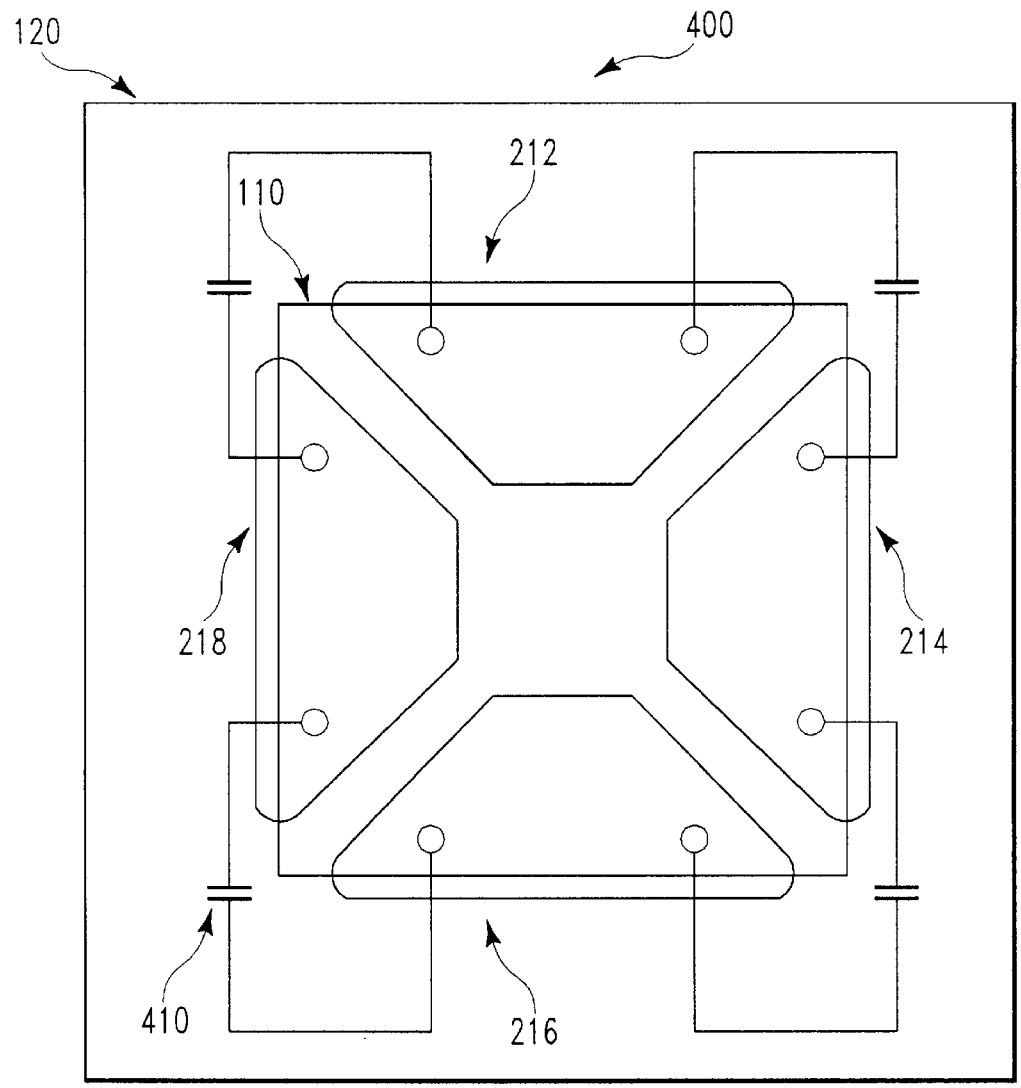
FIGS. 4a and 4b show an electronic package with a device decoupling.
Figure 4B:
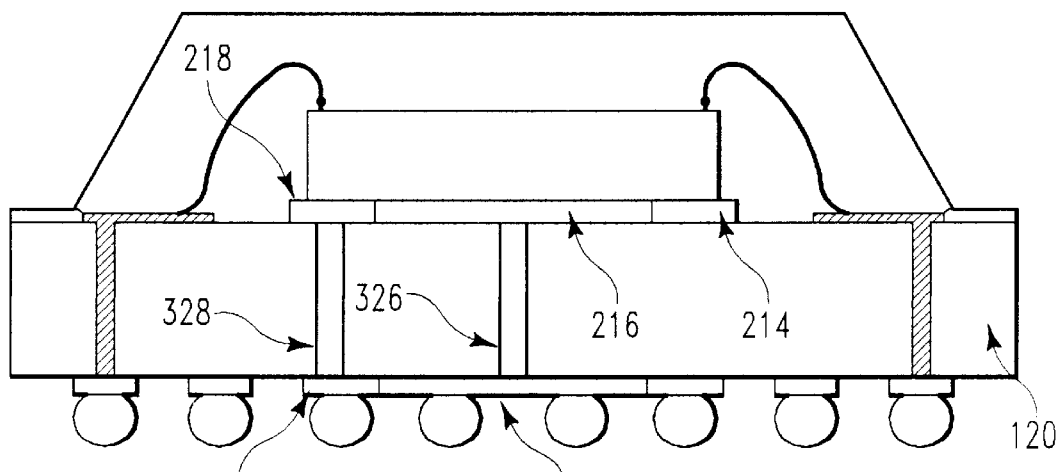

Referring now to FIG. 4a and FIG. 4b, an electronic package with a device decoupling is shown.

With regard particularly to FIG. 4a, a top view of a BGA 400 is depicted. The BGA 400 includes the device 110 attached to the substrate 120 by means of the conductive pad described above; particularly, the pad is split in four different parts 212–218.

In order to provide a better device decoupling action, at least a first part of the pad, such as part 216, is connected to the ground potential, while at least a second one, such as part 218, is connected to the power potential; the two parts 216 and 218 are then connected to each other by means of a decoupling capacitor 410. In a preferred embodiment of the present invention, the four parts 212–218 are connected in interfacing couples at different electric potentials GND and VCC (not shown). In the depicted example, connections to the capacitors are achieved through lines extending from each part of the pad to the corresponding capacitor. It should be noted that this solution provides a signal noise level abatement for electrical performances. Those skilled in the art will appreciate that this decoupling action may be obtained even if these parts 212–218 are separated by a narrow area not wireable; in a preferred embodiment of the present invention, these parts 212–218 are however separated by an area wide enough to provide the above described wiring channels.

As shown in the cross section of FIG. 4b, the pad on the top surface of the substrate 120 is connected to a further pad provided on the bottom surface of the substrate 120; particularly, the part 216 is connected to the further part 336 by means of the conductive hole 326 and the part 218 is connected to another further pad 338 through another thermal via 328. These further parts provided on the bottom surface of the substrate 120 offer very short connections to the bonding pads (VCC or GND) presents on the same side not requiring drilled holes for those connections. The connecting balls positioned in the two areas GND and VCC are multi access points with resulting very low resistance values.

Figure 5:
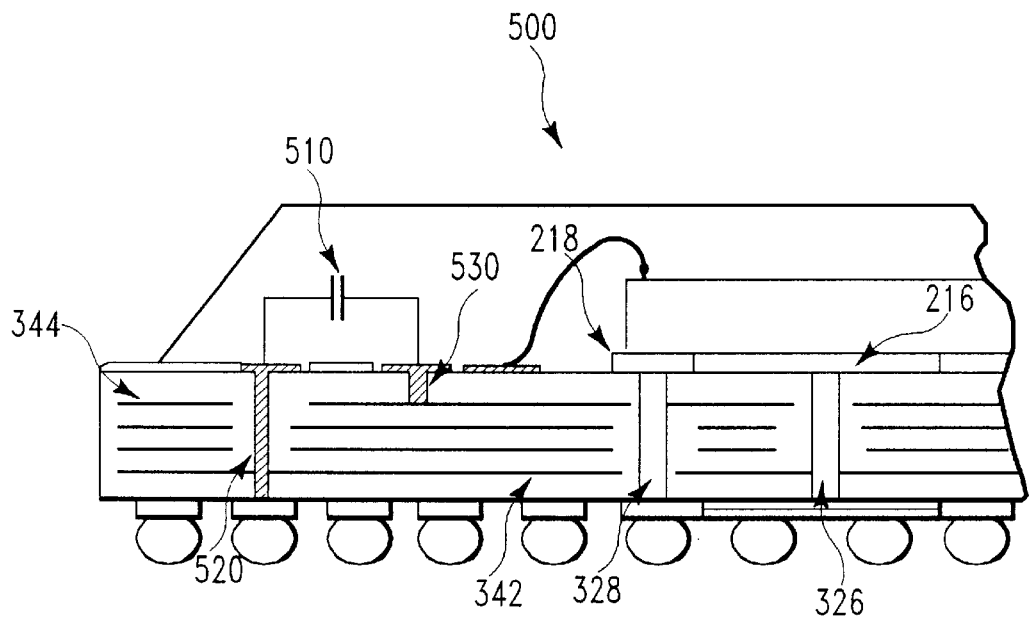
FIG. 5 depicts a further electronic package with a device decoupling.

A further embodiment of an electronic package with a device decoupling is shown in FIG. 5.

The BGA 500 is a multilayer structure including the ground layer 342 and the power layer 344; the metallized hole 326 is connected to the part 216 of the conductive pad, while the hole 328 is connected to the part 218 thereof.

In the particular advantageous embodiment of FIG. 5, the connections in interfacing couples at different electric potentials GND and VCC are achieved on the same chip carrier, using the thermal vias of each part of the pad as connections to the VCC or the GND planes, and the capacitors assembled in close proximity to the device. In the depicted example, the part 216 is connected to the ground plane 342 by the hole 326 and the part 218 is connected to the power layer 344 by the hole 328.

The connections to the capacitor 510 are achieved through further metallized holes; particularly, the capacitor 510 is connected to the ground layer by means of a hole 520 and to the power layer 344 by another hole 530. This embodiment of the present invention enhances the device electrical performances allowing an ideal device decoupling, with no extra wiring required beyond the drilled holes to drive the connections from the inner layers (VCC or GND) to the top surface of the laminate.

We claim:

1. An electronic package including a substrate (120) and at least one device (110), said at least one device (110) being attached to said substrate (120) by means of a first conductive pad provided on a first surface of said substrate (120), said first conductive pad being segmented into a plurality of parts (212–218), wherein each of said plurality of parts being not in contact with any other of said plurality of parts.

2. The electronic package according to claim 1, wherein said plurality of parts (212–218) are separated by a wireable area (222–228) of said substrate (120).

3. An electronic package including a substrate (120) and at least one device (110), said at least one device (110) being attached to said substrate (120) by means of a first conductive pad provided on a first surface of said substrate (120), said first conductive pad being segmented into a plurality of parts (212–218), wherein each of said plurality of parts being not in contact with any other of said plurality of parts, wherein said plurality of parts (212–218) are separated by a wireable area (222–228) of said substrate (120), and wherein said device (110) includes four corners, said first conductive pad being segmented into four parts (212–218) and said wireable area (222–228) having the form of a cross extending from said corners.

4. The electronic package according to claim 1, wherein said electronic package is a multi chip module.

5. An electronic package including a substrate (120) and at least one device (110), said at least one device (110) being attached to said substrate (120) by means of a first conductive pad provided on a first surface of said substrate (120), said first conductive pad being segmented into a plurality of parts (212–218), wherein each of said plurality of parts being not in contact with any other of said plurality of parts, and wherein at least a first of said parts (216) is connected to a ground potential and at least a second of said parts (218) is connected to a power potential, said first (216) and said second (218) parts being connected to each other by means of a decoupling capacitor (410).

6. The electronic package according to claim 1, wherein said substrate (310) includes at least one conductive hole (326) connected to at least one (216) of said parts (212–218).

7. The electronic package according to claim 6, comprising a second conductive pad provided on a second surface of said substrate (310), said second conductive pad being segmented into a plurality of further parts (334–338), wherein each of said plurality of further parts being not in contact with any other of said plurality of further parts, at least one of said further parts (336) of said second conductive pad being connected to a corresponding one of said parts (216) of said first conductive pad by means of at least one of said holes (326).

8. An electronic package including a substrate (120) and at least one device (110), said at least one device (110) being attached to said substrate (120) by means of a first conductive pad provided on a first surface of said substrate (120), said first conductive pad being segmented into a plurality of parts (212–218), wherein each of said plurality of parts being not in contact with any other of said plurality of parts, wherein said substrate (310) includes at least one conductive hole (326) connected to at least one (216) of said parts (212–218), and wherein said substrate (310) includes a ground layer (342) and a power layer (344), said first part (216) being connected to said ground layer (342) by means of a first (326) of said holes and said second part (218) being connected to said power layer (344) by means of a second (328) of said holes.

9. An electronic package including a substrate (120) and at least one device (110), said at least one device (110) being attached to said substrate (120) by means of a first conductive pad provided on a first surface of said substrate (120), said first conductive pad being segmented into a plurality of parts (212–218), wherein each of said plurality of parts being not in contact with any other of said plurality of parts, wherein said substrate (310) includes at least one conductive hole (326) connected to at least one (216) of said parts (212–218), further comprising a second conductive pad provided on a second surface of said substrate (310), said second conductive pad being segmented into a plurality of further parts (334–338), wherein each of said plurality of further parts being not in contact with any other of said plurality of further parts, at least one of said further parts (336) of said second conductive pad being connected to a corresponding one of said parts (216) of said first conductive pad by means of at least one of said holes (326), and wherein a first part (216) of said first conductive pad being connected to a ground potential by means of a corresponding first (326) of said further parts of said second conductive pad and a second part (218) of said first conductive pad being connected to a power potential by means of a corresponding second (328) of said further parts of said second conductive pad.

10. An electronic package including a substrate (120) and at least one device (110), said at least one device (110) being attached to said substrate (120) by means of a first conductive pad provided on a first surface of said substrate (120), said first conductive pad being segmented into a plurality of parts (212–218), wherein each of said plurality of parts being not in contact with any other of said plurality of parts, wherein said electronic package is a BGA.

* * * * *